United States Patent
Balseanu et al.

(10) Patent No.: US 7,790,635 B2
(45) Date of Patent: Sep. 7, 2010

(54) METHOD TO INCREASE THE COMPRESSIVE STRESS OF PECVD DIELECTRIC FILMS

(75) Inventors: Mihaela Balseanu, Sunnyvale, CA (US); Victor T. Nguyen, Novato, CA (US); Li-Qun Xia, Cupertino, CA (US); Vladimir Zubkov, Mountain View, CA (US); Derek R. Witty, Fremont, CA (US); Hichem M'Saad, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 536 days.

(21) Appl. No.: 11/610,991

(22) Filed: Dec. 14, 2006

(65) Prior Publication Data
US 2008/0146007 A1  Jun. 19, 2008

(51) Int. Cl.
*H01L 21/31* (2006.01)
(52) U.S. Cl. .................. 438/793; 438/792; 257/E21.09
(58) Field of Classification Search ................ 438/792, 438/793
See application file for complete search history.

(56) References Cited
U.S. PATENT DOCUMENTS

| | | | |
|---|---|---|---|
| 6,417,092 B1 | 7/2002 | Jain et al. | |
| 7,037,803 B2 | 5/2006 | Inoue et al. | |
| 2003/0036280 A1 | 2/2003 | Jain et al. | |
| 2005/0287747 A1 | 12/2005 | Chakravarti et al. | |
| 2006/0009041 A1 | 1/2006 | Iyer et al. | |
| 2006/0105106 A1 | 5/2006 | Balseanu et al. | |
| 2006/0138566 A1 | 6/2006 | Chakravarti et al. | |
| 2006/0269692 A1* | 11/2006 | Balseanu et al. ............. | 427/569 |
| 2006/0269693 A1 | 11/2006 | Balseanu et al. | |
| 2007/0007548 A1 | 1/2007 | Conti et al. | |

FOREIGN PATENT DOCUMENTS

| | | |
|---|---|---|
| KR | 1020010032726 A | 4/2001 |
| KR | 1020060079857 A | 7/2006 |
| WO | WO-2006014471 A1 | 2/2006 |

OTHER PUBLICATIONS

U.S. Appl. No. 11/478,273, filed Jun. 29, 2006, Entitled: Decreasing the Etch Rate of Silicon Nitride by Carbon Addition.

(Continued)

*Primary Examiner*—Alexander G Ghyka
(74) *Attorney, Agent, or Firm*—Patterson & Sheridan, LLP

(57) ABSTRACT

A method for forming a compressive stress carbon-doped silicon nitride layer is provided. The method includes forming an initiation layer and a bulk layer thereon, wherein the bulk layer has a compressive stress of between about −0.1 GPa and about −10 GPa. The initiation layer is deposited from a gas mixture that includes a silicon and carbon-containing precursor and optionally a nitrogen and/or source but does not include hydrogen gas. The bulk layer is deposited from a gas mixture that includes a silicon and carbon-containing precursor, a nitrogen source, and hydrogen gas. The initiation layer is a thin layer that allows good transfer of the compressive stress of the bulk layer therethrough to an underlying layer, such as a channel of a transistor.

24 Claims, 5 Drawing Sheets

OTHER PUBLICATIONS

U.S. Appl. No. 60/805,324, filed Jun. 20, 2006, Entitled: Method to Increase Silicon Nitride Tensile Stress Using Nitrogen Plasma In-Situ Treatment and Ex-Situ UV Cure.

U.S. Appl. No. 11/245,373, filed Oct. 6, 2005, Entitled: Method and Apparatus for the low Temperature Deposition of Doped Silicon Nitride Films.

First Office Action dated Jun. 26, 2009, issued by the State Intellectual Property Office of the People's Republic of China in Chinese Patent Application Serial No. 200710165143.8.

Notice to File a Response dated Sep. 11, 2009, issued by the Korean Intellectual Property Office in KR 1020070103998.

* cited by examiner

METHOD TO INCREASE THE COMPRESSIVE STRESS OF PECVD DIELECTRIC FILMS

BACKGROUND OF THE INVENTION

1. Field of the Invention

Embodiments of the present invention generally relate to the fabrication of integrated circuits. More particularly, embodiments of the present invention relate to methods for depositing carbon-doped silicon nitride layers that have compressive stress.

2. Description of the Related Art

Integrated circuits are composed of many, e.g., millions, of devices such as transistors, capacitors, and resistors. The transistors may include metal-oxide-semiconductor field effect transistors (MOSFETs).

A MOSFET includes a gate structure that is disposed between a source region and a drain region defined in a semiconductor substrate. The gate structure or stack generally comprises a gate electrode formed on a gate dielectric material. The gate electrode controls a flow of charge carriers beneath the gate dielectric in a channel region that is formed between the drain region and the source region so as to turn the transistor on or off.

The performance of a MOSFET device can be improved by several methods, such as reducing the supply voltage, reducing the gate dielectric thickness, or reducing the channel length. However, such methods are becoming more difficult as devices become smaller and more densely spaced on semiconductor substrates. For example, if a very thin gate dielectric is used, dopants from the gate electrode may penetrate through the gate dielectric into the underlying silicon substrate. A very thin gate dielectric may also increase gate leakage that increases the amount of power consumed by the gate and eventually damages the transistor.

Straining the atomic lattice of materials in devices is a recently developed, alternative method of improving device performance. Straining the atomic lattice improves device performance by increasing carrier mobility in a semiconductor material. The atomic lattice of one layer of a device can be strained by depositing a stressed film over the layer. For example, stressed silicon nitride layers used as etch stop layers over a gate electrode can be deposited to induce strain in the channel region of the transistor. The stressed silicon nitride layers can have compressive stress or tensile stress. The selection of a compressive or tensile stress layer is based on the type of underlying device. Typically, tensile stress layers are deposited over NMOS devices, and compressive stress layers are deposited over PMOS devices. It has been observed that PMOS device performance increases approximately linearly with the level of compressive stress of a silicon nitride contact liner or etch stop over the device.

While plasma-enhanced chemical vapor deposited (PECVD) silicon nitride (SiN) layers that have high compressive stress levels have been developed, there remains a need for layers with higher levels of compressive stress to further improve device performance.

SUMMARY OF THE INVENTION

The present invention generally provides methods of forming compressive stress nitride layers. The compressive stress nitride layers comprise silicon, carbon, and nitrogen and may be carbon-doped silicon nitride layers.

In one embodiment, a method of depositing a two layer film having compressive stress is provided, wherein the method includes depositing an initiation layer comprising silicon and carbon, and optionally nitrogen and/or oxygen on a substrate and depositing a bulk layer comprising silicon, carbon, and nitrogen on the initiation layer. The initiation layer is deposited from a first gas mixture in the presence of RF power, wherein the first gas mixture comprises a silicon and carbon-containing precursor and optionally a nitrogen source and/or an oxygen source. The first gas mixture does not include hydrogen gas. The bulk layer is deposited from a second gas mixture in the presence of RF power, wherein the second gas mixture comprises a silicon and carbon-containing precursor, a nitrogen source, and hydrogen gas. The bulk layer has a compressive stress of between about –0.1 GPa and about –10 GPa.

In another embodiment, a method of depositing a layer comprising compressive stress is provided, wherein the method includes depositing an initiation layer comprising silicon, carbon, and nitrogen on a substrate and depositing a bulk layer comprising silicon, carbon, and nitrogen on the initiation layer. The initiation layer is deposited in the presence of a plasma from a first gas mixture that comprises a silicon and carbon-containing precursor and a nitrogen source and does not include hydrogen gas. The plasma is continued after the deposition of the initiation layer, and the bulk layer is also deposited in the presence of the plasma. The bulk layer is deposited from a second gas mixture comprising a silicon and carbon-containing precursor, a nitrogen source, and hydrogen gas. The bulk layer has a compressive stress of between about –0.1 GPa and about –10 GPa.

In another embodiment, a method of pre-cleaning a substrate is provided. The method comprises treating a substrate comprising an upper surface comprising a silicide with a gas mixture comprising nitrogen and hydrogen in the presence or absence of a plasma and then depositing a compressive stress nitride film or a tensile stress nitride film on the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention provide a method of depositing a layer that has compressive stress and comprises silicon, carbon, and nitrogen. The layer may be a carbon-doped silicon nitride layer having between about 2 and 95 atomic percent carbon. The compressive stress of the layer is between about −0.1 GPa and about −10 GPa.

Figure 1:
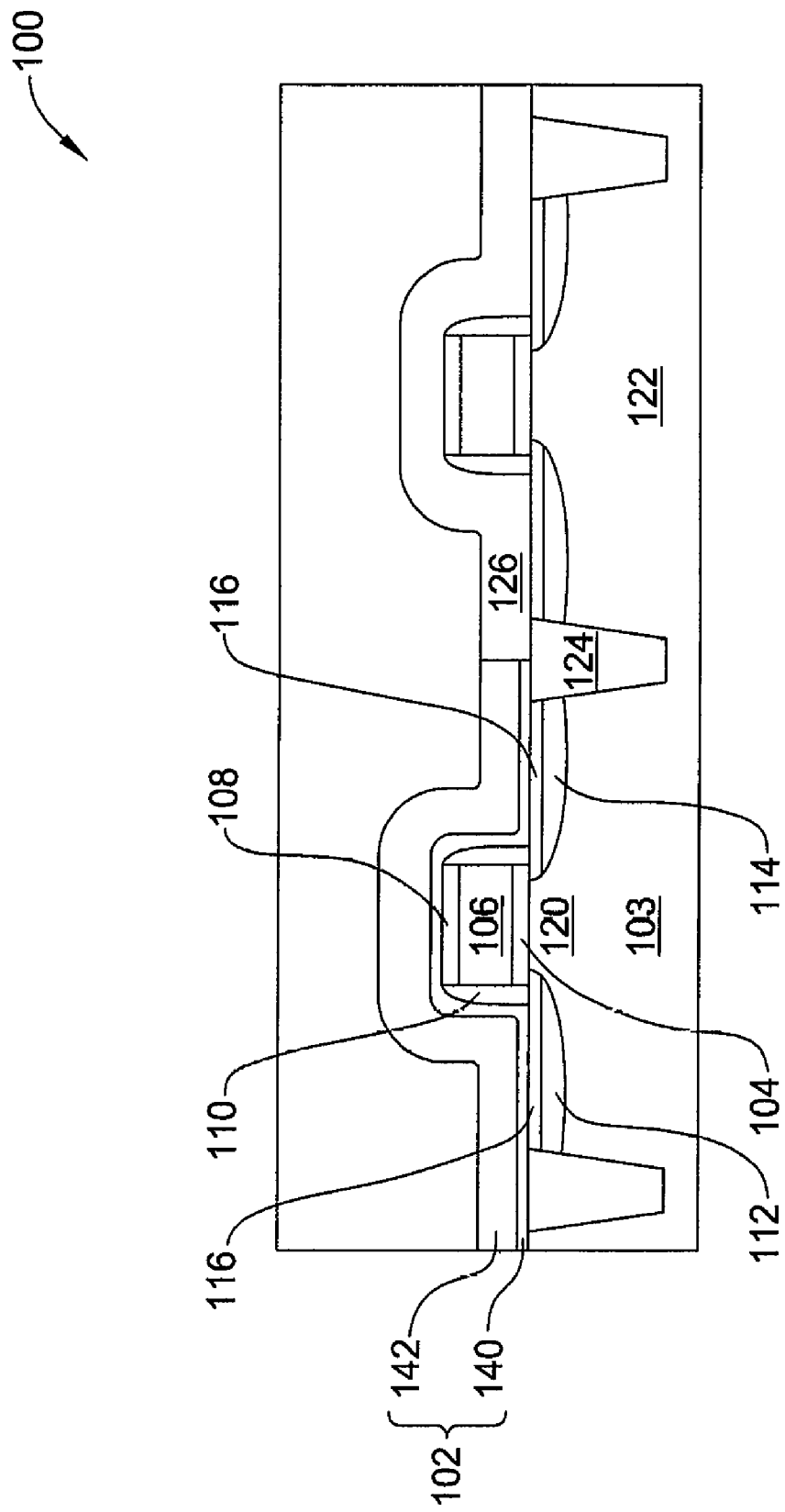
FIG. 1 is a schematic cross-sectional view of a transistor structure including a compressive stress layer according to an embodiment of the invention.

The layer may be used as a barrier layer or an etch stop layer. FIG. 1 is an example of a structure 100 in which the layer is used as an etch stop layer 102. The layer is deposited over a gate stack structure which is over a PMOS substrate region 103. The gate stack structure includes a gate dielectric 104, which may be an oxide, a polysilicon layer 106 on the gate dielectric, and a metal silicide 108, such as a nickel silicide, on the polysilicon layer 106, and spacers 110 on the sides of the gate dielectric 104, polysilicon layer 106, and the metal suicide 108. It is noted that the layer may be deposited over a gate stack structure comprising layers having different compositions. The gate stack structure is located between a source 112 and drain 114. Thin metal silicide layers 116 are located on top of the source 112 and drain 114. A channel region 120 is formed in the PMOS substrate region 103 between the source 112 and the drain 114. The structure 100 also includes an NMOS device including an NMOS substrate region 122 that is separated from the PMOS substrate region 103 by a trench 124. The NMOS device has a tensile stress layer 126 thereon.

The structure 100 also includes a premetal dielectric layer 130 over the etch stop layer 102 and the tensile stress layer 126. In a subsequent etching step (not shown), the premetal dielectric layer 130 may be etched to form a contact hole therein, wherein the etch stop layer 102 acts as the etch stop. The etch stop layer 102 may then be etched to expose the underlying metal silicide, and a tungsten plug may be deposited in the contact hole.

As shown in FIG. 1, the etch stop layer 102 comprises two layers, 140 and 142. Layer 140 is an initiation layer having a thickness of between about 5 Å and about 500 Å. Layer 142 is a bulk layer that may have a thickness of between about 10 Å and about 10000 Å.

A method of depositing a two layer film, such as the etch stop layer 102, that comprises an initiation layer and a bulk layer thereon will be described below.

Optionally, before the initiation layer is deposited on a substrate, the substrate may be pre-cleaned by treating the substrate with a gas mixture comprising nitrogen and hydrogen in the presence or absence of a plasma. The substrate comprises an upper surface comprising a silicide, e.g., metal silicide 108 and metal silicide layers 116 The silicide may be a cobalt silicide or a nickel silicide, for example. The gas mixture may include ammonia ($NH_3$), hydrazine ($N_2H_4$), $N_2$ gas, or combinations thereof, for example. In one aspect, the substrate is cleaned with an ammonia ($NH_3$) soak. The presence of a plasma during the treatment enhances the cleaning efficiency of the gas mixture. The plasma may be formed by high frequency RF power at about 13.56 MHz, low frequency RF power at about 350 kHz, or a combination thereof, and the power level of the RF power is in the range of about 5 W to about 3000 W. The substrate may be treated in the same chamber that is used to deposit the initiation layer.

While the pre-cleaning method is described above with respect to treating a substrate before an initiation layer according to embodiments of the invention is deposited thereon, it is recognized that the pre-cleaning method including treating a substrate with a gas mixture comprising nitrogen and hydrogen in the presence or absence of plasma may be performed on a substrate before other films are deposited on the substrate, such as other compressive stress nitride films and tensile stress nitride films.

The initiation layer is deposited from a gas mixture in the presence of a plasma. The initiation layer comprises silicon, carbon, and optionally nitrogen and/or oxygen and may be a carbon-doped silicon nitride, for example. The gas mixture comprises a silicon and carbon-containing precursor and optionally a nitrogen source and/or an oxygen source. The nitrogen source in the gas mixture may be ammonia, hydrazine, or nitrogen. The oxygen source may be nitrous oxide ($N_2O$) or oxygen gas ($O_2$).

The gas mixture may further comprise nitrogen gas ($N_2$), a carrier gas, such as argon or helium, or xenon. The gas mixture does not include added hydrogen ($H_2$) gas. The gas mixture may also include a silicon precursor that does not include carbon, such as silane. The initiation layer provides a layer that blocks the penetration of hydrogen gas or non-bonded hydrogen therethrough to an underlying layer of the substrate. The penetration of hydrogen gas or non-bonded hydrogen to an underlying layer of a substrate that is part of a transistor device can degrade the performance of the transistor.

In one embodiment, the silicon and carbon-containing precursor may be an organosilicon compound that comprises a silicon-carbon bond. The silicon and carbon-containing precursor may have the structure $SiR_1R_2R_3R_4$, wherein at least one of the R's is an alkyl group and the other R's are alkyl groups or hydrogen. The silicon and carbon-containing precursor may be an alkylsilane, an alkylaminosilane, or an orgonasilazane. Examples of silicon and carbon-containing precursors that may be used include methylsilane (MS), trimethylsilane (TMS) and tetramethylsilane (4MS).

The silicon and carbon-containing precursor may also comprise nitrogen. For example, the silicon and carbon-containing precursor may be an aminosilane, such as an alkylaminosilane, e.g., hexamethyidisilazane (HMDS) hexamethylcyclotrisilazane (HMCTZ), tris(dimethylamino)silane (TDMAS), tetra(dimethylamino)silane (TDMAS), or bis(tertiary-butylamino)silane (BTBAS).

The silicon and carbon-containing precursor may also comprise oxygen. For example, the silicon and carbon-containing precursor may comprise octamethylcyclotetrasiloxane (OMCTS) or methyldiethoxysilane (MDEOS).

In another embodiment, the silicon and carbon-containing precursor comprises two or more compounds, wherein at least one of the compounds is a silicon-containing compound and at least one of the other compounds is a carbon-containing compound. Examples of silicon-containing compounds that may be used include silane, disilane, and trisilylamine (TSA). The carbon-containing compound may be an alkane, alkene, or alkyne. Examples of carbon-containing compounds that may be used include alpha-terpinene (ATRP), toluene, limonene, pyran, cyclopentene, 1-methyl cyclopentene, and norbornadiene.

As stated above, the initiation layer is deposited from the gas mixture in the presence of a plasma. The plasma may be provided by applying RF power in the chamber. The RF power may be provided at a low frequency, such as about 350 kHz at a power level between about 5 W and 1000 W for a 300 mm substrate. The RF power is typically provided to a gas distribution assembly or "showerhead" electrode in the chamber. Alternatively or additionally, the RF power may be applied to a substrate support in the chamber. The RF power may be cycled or pulsed and continuous or discontinuous.

The initiation layer may be deposited in a chemical vapor deposition chamber or a plasma enhanced chemical vapor deposition chamber by reacting a gas mixture comprising an organosilicon compound in the presence of RF power. Examples of chambers that may be used to deposit the layer include a PRODUCER® chamber with two isolated processing regions and a DxZ® chamber, both of which are available from Applied Materials, Inc. of Santa Clara, Calif. The processing conditions provided herein are provided for a 300 mm PRODUCER® chamber with two isolated processing regions. Thus, the flow rates experienced per each substrate processing region and substrate are half of the flow rates into the chamber.

For the deposition of the initiation layer, the silicon and carbon-containing precursor may be introduced into the chamber at a flow rate of between about 1 sccm and about 50,000 sccm. The nitrogen source may be introduced into the chamber at a flow rate of between about 1 sccm and about 50,000 sccm. A carrier gas may be introduced into the chamber at a flow rate of between about 1 sccm and about 50,000 sccm. Nitrogen ($N_2$) gas may be introduced into the chamber at a flow rate of between about 1 sccm and about 50,000 sccm.

During deposition of the initiation layer on the substrate in the chamber, the substrate is typically maintained at a temperature between about 100° C. and about 580° C. In embodiments in which the initiation layer is deposited on a nickel silicide layer of a substrate, the substrate is typically maintained at a temperature of about 480° C. or less. However, in other embodiments, the substrate may be maintained at a temperature of between about 480° C. and about 580° C., such as greater than 480° C. to about 580° C. Substrate temperatures of between about 481° C. and about 580° C. can be provided by chambers having ceramic heaters, such as the PRODUCER® chamber, available from Applied Materials, Inc. of Santa Clara, Calif. In any of the embodiments, the pressure in the chamber may be between about 5 mTorr and about 50 Torr.

The initiation layer may be deposited for a period of time sufficient to provide a layer thickness of between about 5 Å and about 500 Å, such as for about 15 seconds.

In a specific embodiment, the following processing conditions are used to deposit the initiation layer: 150 sccm $NH_3$, 60 sccm TMS, 2000 sccm Ar, 2000 sccm $N_2$, and 75 W of RF power at 350 MHz for a period of 15 seconds.

After the initiation layer is deposited, the bulk layer may be deposited on the initiation layer in the same chamber. Thus, the bulk layer may be deposited on the initiation layer on a substrate on a single substrate support in the chamber, wherein the substrate is not removed from the substrate support between the deposition of the initiation layer and the deposition of the bulk layer. As both the initiation layer and the bulk layer are deposited in the presence of a plasma and the plasma is not turned off in the chamber between the deposition of the initiation layer and the bulk layer, the deposition of the initiation layer and of the bulk layer may be considered "back to back" plasma processes.

Preferably, there is a transition period after the initiation layer is deposited and before the bulk layer is deposited which minimizes plasma instability. The flows of the gases from the first gas mixture are continued into the chamber during the transition period, although the flow rates of some of the gases may be changed, as described below. The substrate temperatures and chamber pressures used for the deposition of the initiation layer may be maintained through the transition period and the deposition of the bulk layer.

The transition period comprises a first step in which high frequency RF power is turned on in the chamber. The high frequency RF power may be provided at between about 5 W and about 3000 W at 13.56 MHz, such as at about 50 W. Turning on the high frequency RF power increases the total RF power in the chamber. The flow rates of the gases in the gas mixture used to deposit the initiation layer and the other initiation layer processing conditions, including the application of low frequency RF power, are maintained during the first step. The length of the first step may be about one second.

The transition period also comprises a second step in which the high frequency RF power and the total RF power are further increased. The high frequency RF power may be increased to between about 5 W and about 3000 W, such as about 105 W. The low frequency RF power may be decreased to between about 5 W and about 1000 W, such as about 30 W. The flow rate of one or more of the gases in the first gas mixture is also adjusted during the second step. For example, the flow rate of the nitrogen source may be decreased to between about 75 sccm and about 200 sccm, e.g., about 100 sccm, the flow rate of the carrier gas may be increased to between about 100 sccm and about 50,000 sccm, e.g., about 3500 sccm, and the flow rate of the nitrogen gas may be decreased to between about 10 sccm and about 10,000 sccm, e.g., about 1000 sccm. The length of the second step may be about one second.

The bulk layer is deposited after the second step of the transition period. The bulk layer is deposited using the same processing conditions, including flow rates and powers, which were achieved at the end of the second step with the exception that hydrogen gas is introduced into the chamber during the deposition of the bulk layer. The hydrogen gas may be introduced at a flow rate of between about 5 sccm and about 20,000 sccm. Typically, the bulk layer is deposited from a second gas mixture that includes a silicon and carbon-containing precursor, a nitrogen source, hydrogen gas, and an inert gas such as argon, xenon, helium, or nitrogen. The bulk layer comprises silicon, carbon, and nitrogen and may be a carbon-doped silicon nitride. The bulk layer may be deposited for a period of time sufficient to obtain a layer having a thickness of between about 10 Å and about 10,000 Å.

In a specific embodiment, the following processing conditions are used to deposit the bulk layer: 100 sccm $NH_3$, 60 sccm TMS, 3500 sccm $H_2$, 3500 sccm Ar, 1000 sccm $N_2$, 105 W of RF power at 13.56 kHz, and 30 W of RF power at 350 MHz for a period of 156 seconds. This bulk layer may be deposited after an initiation layer is deposited according to the specific initiation layer embodiment described above.

Figure 2:
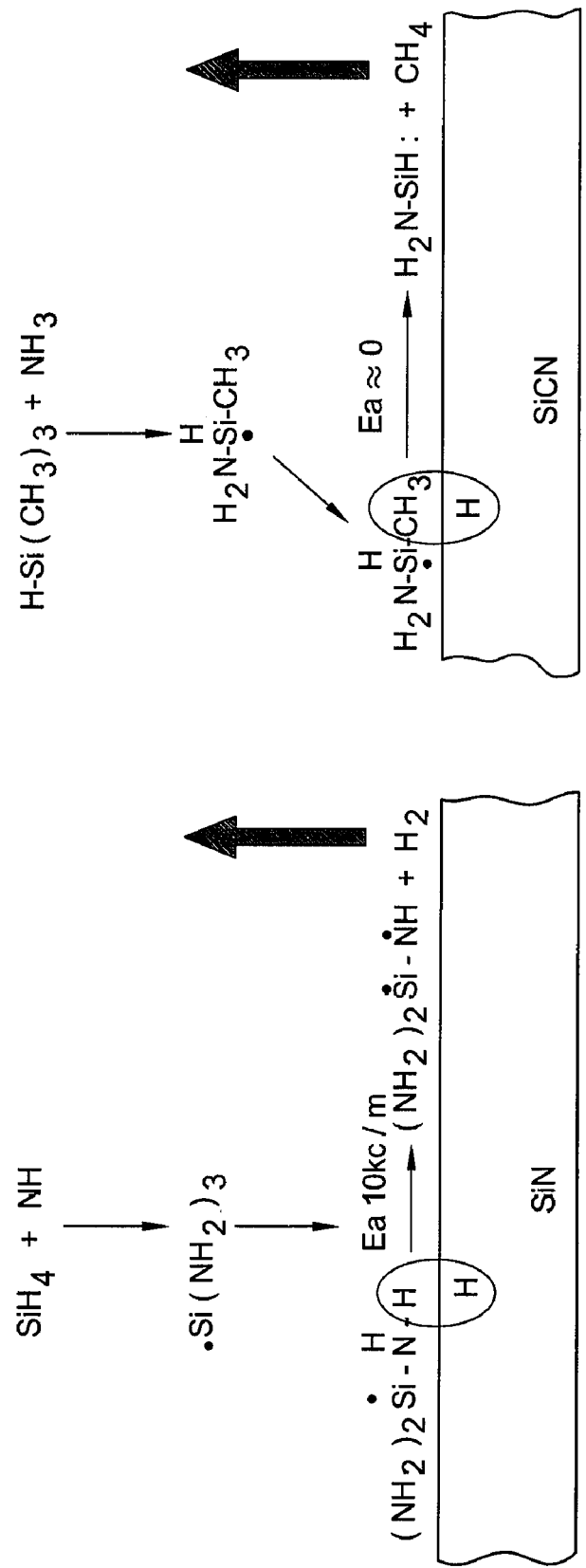
FIG. 2 is a schematic diagram of the deposition of a compressive stress layer on a substrate according to an embodiment of the invention and of a layer according to the prior art.

By using a silicon and carbon-containing precursor rather than silane to deposit the bulk layer such that the bulk layer comprises carbon in addition to silicon and nitrogen, the non-bonded hydrogen content of the bulk layer is reduced. FIG. 2 shows the proposed mechanism of removal of non-bonded hydrogens from silicon nitride films deposited from silane and carbon-doped silicon nitride films deposited using a silicon and carbon-containing precursor according to embodiments of the invention. The reaction of the silicon and carbon-containing precursor with methyl groups in the carbon-doped silicon nitride films to remove hydrogen from the film has a lower activation energy (Ea) than the reaction of silane with hydrogen in a silicon nitride film to remove hydrogen from the film.

Reducing the non-bonded hydrogen content of the bulk layer is desirable because a thinner initiation layer, i.e., barrier layer for preventing the penetration of hydrogen gas or non-bonded hydrogen to an underlying layer of the substrate, may be used if there is less hydrogen in the bulk layer. A thinner initiation layer is desirable as a thinner layer allows a better transfer of the compressive stress of the bulk layer through the initiation layer to an underlying channel of a transistor of the substrate.

Table 1 shows a comparison of the properties of a silane (SiH$_4$)-based bulk compressive stress nitride layer according to the prior art and a TMS-based bulk compressive stress nitride layer according to embodiments of the invention. As shown by Table 1, a silicon, carbon, and nitrogen-containing bulk layer that is deposited from a gas mixture including a silicon and carbon-containing precursor can be formed with a compressive stress comparable to a SiH$_4$-based silicon nitride layer. Table 1 also shows that the silicon, carbon, and nitrogen-containing layer has a desirable, i.e., lower, wet etch rate (WER) than a silicon nitride layer that does not include carbon.

TABLE 1

| Film Properties | SiH$_4$-based Compressive Nitride | TMS-based Compressive Nitride |
|---|---|---|
| Process Temperature (° C.) | 480 | 480 |
| Initiation Layer Thickness (Å) | 120 | 60 |
| Stress (GPa) | −3.5 | −3.4 |
| Deposition rate (Å/min) | 200 | 160 |
| RI (refractive index) | 1.980 | 2.035 |
| Si:N:H:C (RBS/HFS/XPS) | 32:48:20:— | 30:37:22:11 |
| WER (Å/min) (100:1 HF) | 15 | <3 |
| k (dielectric constant) | 7.5 | 9.0 |
| Leakage (A/cm$^2$ at 2 MV/cm) | $1.5 * 10^{-10}$ | $4 * 10^{-10}$ |
| Vbd (MV/cm) | 9.7 | 7.0 |

The silicon, carbon, and nitrogen-containing bulk layer also exhibited comparable step coverage to a SiH$_4$-based silicon nitride layer. The addition of nitrogen gas to the gas mixture used to deposit the silicon, carbon, and nitrogen-containing layer improved the step coverage of the layer relative to a silicon, carbon, and nitrogen-containing layer that was deposited from a gas mixture that did not include nitrogen gas and a SiH$_4$-based silicon nitride layer. It was also found that the addition of nitrogen gas to the gas mixture improves the sidewall roughness. The addition of nitrogen gas also reduced the refractive index by increasing the NH content and decreasing the SiH content of the layer. The addition of silane to the gas mixture also improved sidewall roughness.

Figure 3:
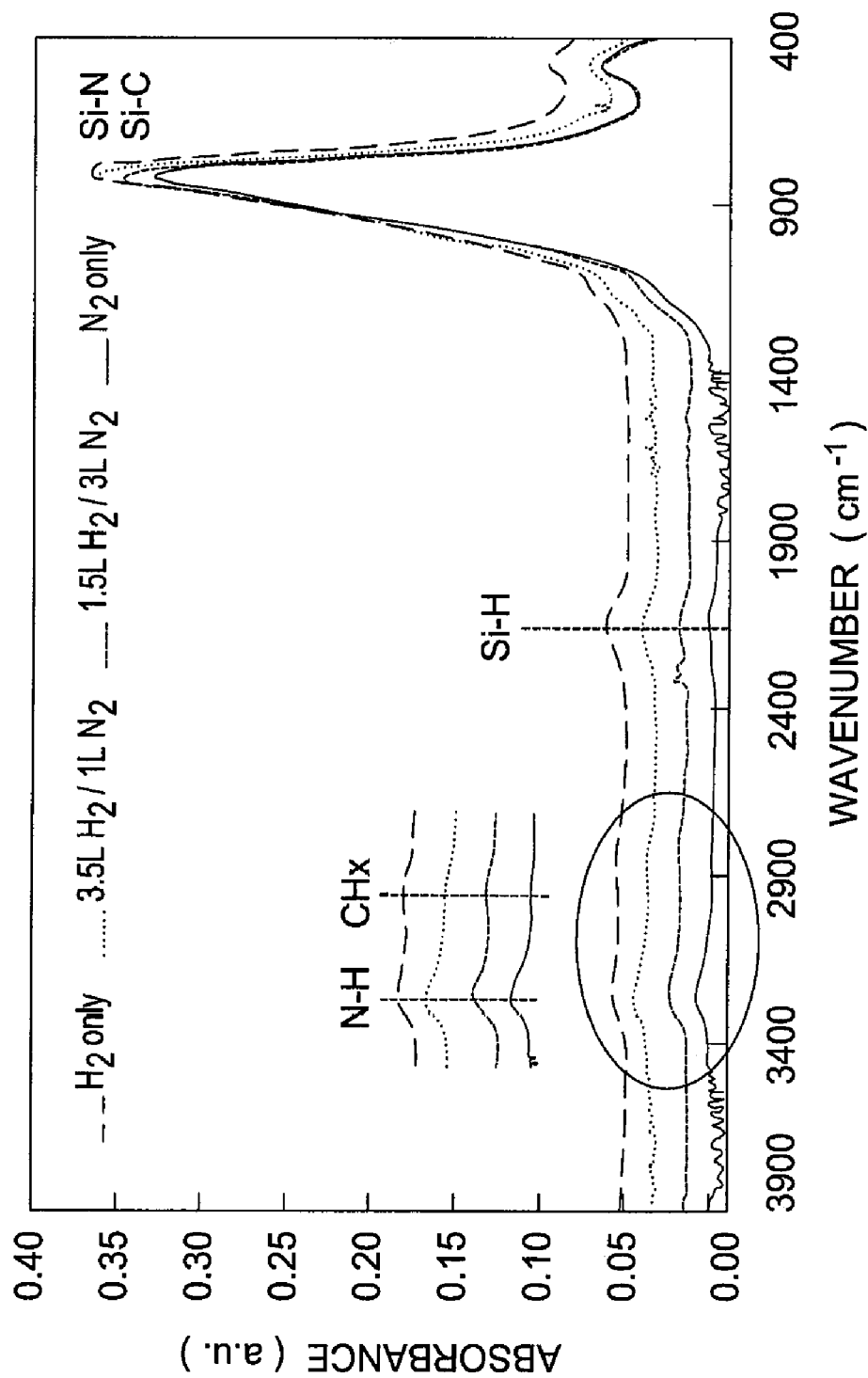
FIG. 3 is a FTIR that shows the effect of different $N_2/H_2$ ratios on the composition of compressive stress layers according to embodiments of the invention.

FIG. 3 shows that increased N$_2$/H$_2$ ratios for the gas mixture used to deposit the bulk layer result in a decrease in the SiH and CHx content and an increase in the NH content of the layer. It was also found that increasing NH$_3$/TMS ratios for the gas mixture used to deposit the bulk layer from 100 sccm NH$_3$/60 sccm TMS to 200 sccm/60 sccm TMS resulted in a decrease in the SiH content and an increase in the NH content in the layer.

Figure 4:
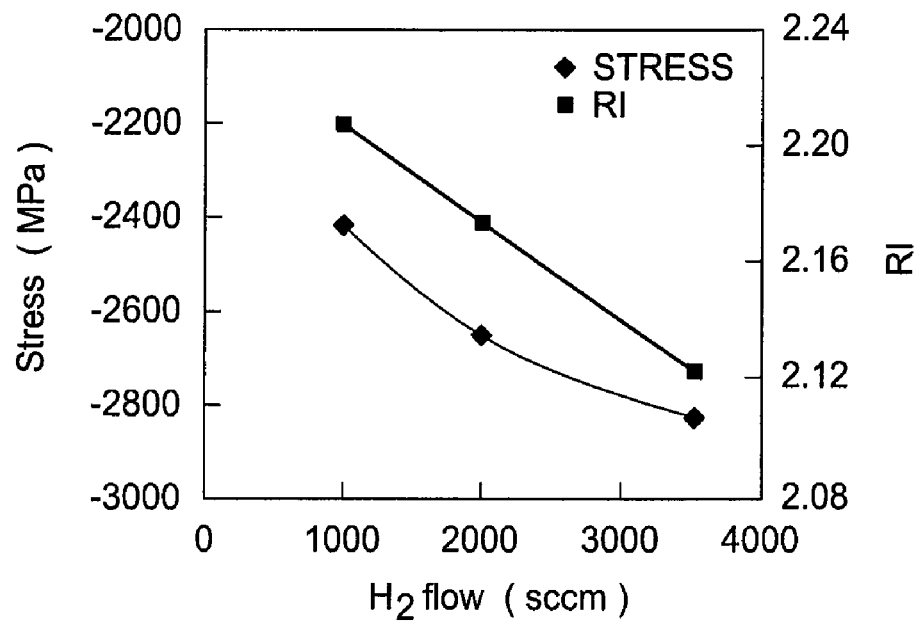
FIGS. 4 and 5 are graphs that show the effect of different hydrogen gas flow rates on the level of compressive stress of layers according to embodiments of the invention.
Figure 5:
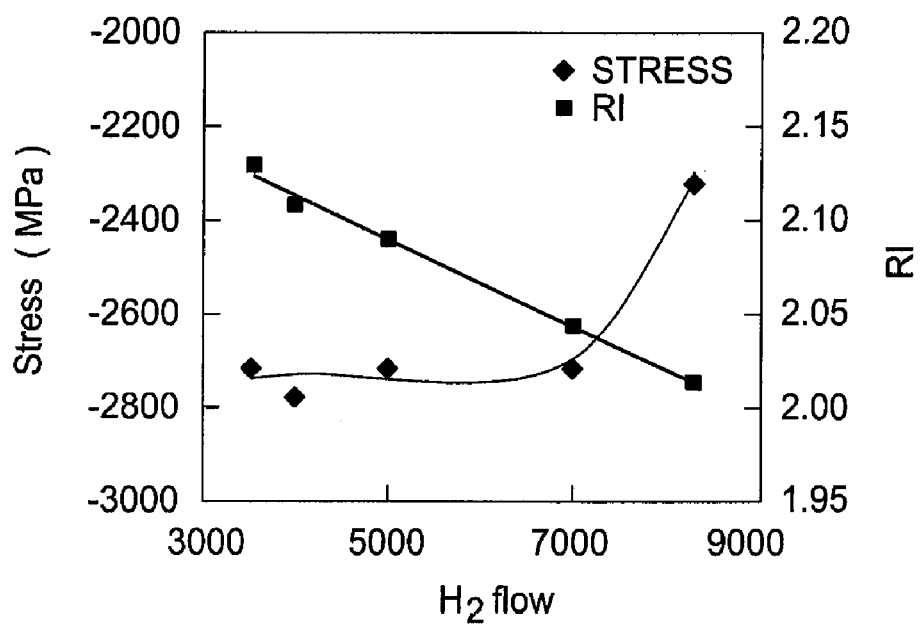

The stress of the bulk layers described herein may be tuned by adjusting the processing conditions used to deposit the layers. For example, FIGS. 4 and 5 show that increased hydrogen gas flow rates during the deposition of the bulk layer increase the compressive stress of the bulk layer. It was also observed that increased hydrogen flow rates improve the film uniformity and decrease the refractive index of the bulk layer.

Figure 6:
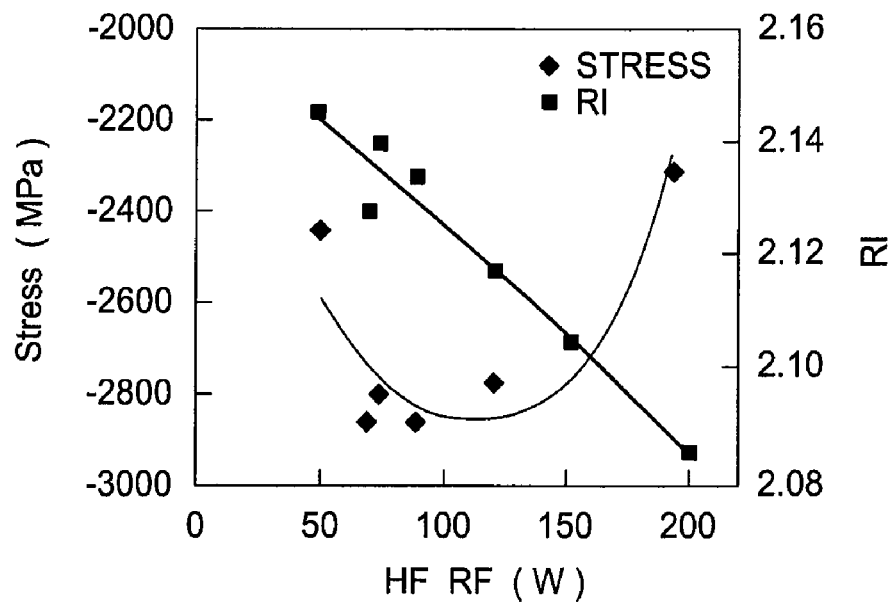
FIG. 6 is a graph that shows the effect of different levels of high frequency RF power on the compressive stress of layers according to embodiments of the invention.
Figure 7:
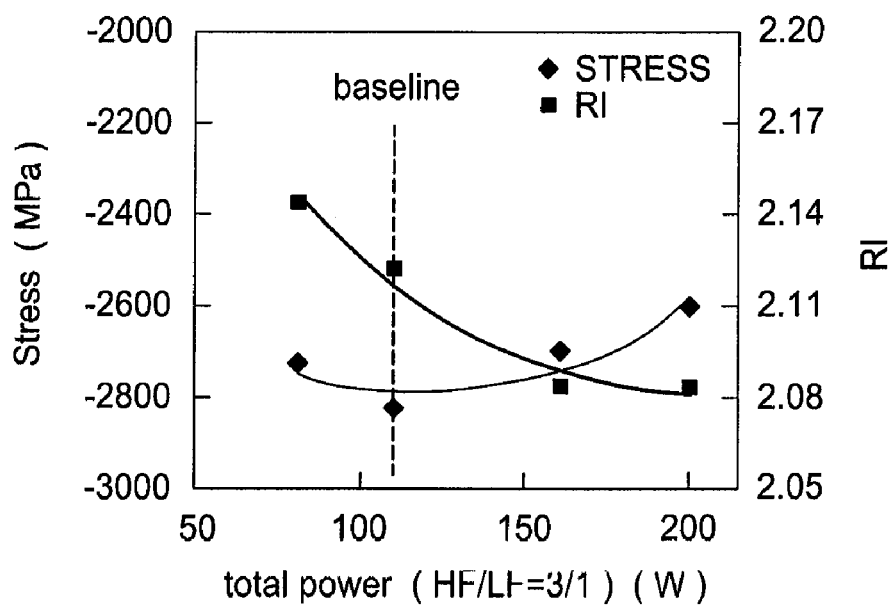
FIG. 7 is a graph that shows the effect of different levels of total RF power including high frequency RF power and low frequency RF power on the compressive stress of layers according to embodiments of the invention.

FIGS. 6 and 7 show that higher compressive stress may be achieved in the bulk layer by reducing the bulk layer deposition plasma density as measured by the level of high frequency power and the total power, respectively.

It was also found that increasing the deposition temperature from 400° C. to 480° C. for bulk layers deposited from gas mixtures comprising TMS increased the stress of the layers from −2.8 GPa to −3.3 GPa without significantly changing the composition of the bulk layers. The increased temperatures also improved the sidewall roughness.

The bulk layers provided herein also exhibit good thermal resistance. For example, no blistering or delamination of the bulk layer from an underlying silicon or NiPtSi layer after a 3 hour anneal at 480° C. was observed for bulk layers deposited from gas mixtures comprising TMS and that were deposited on a substrate that was treated with an ammonia soak before the initiation layer was deposited thereon. The bulk layers also exhibited good adhesion to an underlying NiPtSi layer as measured by a tape test in which scotch tape was applied to the layers and then peeled from the layers without also peeling off the bulk layers.

While the foregoing is directed to embodiments of the present invention, other and further embodiments of the invention may be devised without departing from the basic scope thereof, and the scope thereof is determined by the claims that follow.

What is claimed is:

1. A method of depositing a two layer film having compressive stress, comprising:
   depositing an initiation layer comprising silicon and carbon on a substrate in a chamber from a first gas mixture in the presence of a low frequency RF power, wherein the first gas mixture comprises a silicon and carbon-containing precursor; and then
   turning on a high frequency RF power and depositing a bulk layer comprising silicon, carbon, and nitrogen on the initiation layer from a second gas mixture in the presence of the high frequency RF power, wherein the second gas mixture comprises the silicon and carbon-containing precursor, a nitrogen source, and hydrogen gas, and the bulk layer has a compressive stress of between about −0.1 GPa and about −10 GPa.

2. The method of claim 1, wherein the silicon and carbon-containing precursor is selected from the group consisting of alkylsilanes, alkylaminosilanes, and organosilazanes.

3. The method of claim 1, wherein the silicon and carbon-containing precursor comprises a silicon-containing compound selected from the group consisting of silane, disilane, and trisilylamine (TSA).

4. The method of claim 1, wherein the silicon and carbon-containing precursor comprises a carbon-containing compound selected from the group consisting of alkanes, alkenes, and alkynes.

5. The method of claim 1, wherein the silicon and carbon-containing precursor comprises a carbon-containing compound selected from the group consisting of alpha-terpinene (ATRP), toluene, limonene, pyran, cyclopentene, 1-methyl cyclopentene, and norbornadiene.

6. The method of claim 1, wherein the silicon and carbon-containing precursor further comprises nitrogen.

7. The method of claim 1, wherein the silicon and carbon-containing precursor further comprises oxygen.

8. The method of claim 1, wherein the silicon and carbon-containing precursor comprises trimethylsilane (TMS), methylsilane (MS), hexamethyldisilazane (HMDS), hexamethylcyclotrisilazane (HMCTZ), tris(dimethylamino)silane (TDMAS), tetra(dimethylamino)silane (TDMAS), bis(tertiary-butylamino)silane (BTBAS), or a combination thereof.

9. The method of claim 1, wherein the nitrogen source for the deposition of the bulk layer and for the deposition of the initiation layer comprises ammonia, hydrazine (N$_2$H$_4$), or dimethylhydrazine (N$_2$C$_2$H$_8$).

10. The method of claim 1, wherein the oxygen source comprises N$_2$O or O$_2$.

11. The method of claim 1, wherein the silicon and carbon-containing precursor comprises octamethylcyclotetrasiloxane (OMCTS) or methyldiethoxysilane (MDEOS).

12. The method of claim 1, wherein the second gas mixture further comprises an inert gas selected from the group consisting of argon, xenon, helium and nitrogen.

13. The method of claim 1, wherein the initiation layer has a thickness of between about 5 Å and about 500 Å.

14. The method of claim 1, wherein the bulk layer has a thickness of between about 10 Å and about 10,000 Å.

15. The method of claim 1, wherein the substrate is positioned on a single substrate support in the chamber during the deposition of both the initiation layer and the bulk layer.

16. A method of depositing a two layer film having a compressive stress, comprising:
depositing an initiation layer comprising silicon, carbon, and nitrogen on a substrate in a chamber from a first gas mixture in the presence of a low frequency RF power, wherein the first gas mixture comprises a silicon and carbon-containing precursor and a nitrogen source and does not include hydrogen gas;
continuing the low frequency RF power;
turninq on a high frequency RF power; and then
depositing a bulk layer comprising silicon, carbon, and nitrogen on the initiation layer from a second gas mixture in the presence of the low and high frequency RF powers, wherein the second gas mixture comprises the silicon and carbon-containing precursor, the nitrogen source, and hydrogen gas, and the bulk layer has a compressive stress of between about −3 GPa and about −10 GPa.

17. The method of claim 16, wherein the substrate is positioned on a single substrate support in the chamber during the deposition of both the initiation layer and the bulk layer.

18. The method of claim 16, wherein the temperature of the substrate during the deposition of the initiation layer and the bulk layer is about 480° C. or less.

19. The method of claim 16, wherein the temperature of the substrate during the deposition of the initiation layer and the bulk layer is between about 480° C. and about 580° C.

20. The method of claim 16, wherein the high frequency RF power is turned on between the deposition of the initiation layer and of the bulk layer.

21. The method of claim 16, wherein the high frequency RF power operates at about 13.56 MHz, the low frequency RF power operates at about 350 kHz, and the combined power level of the low and high frequency RF powers is in the range of about 5 W to about 3000 W.

22. The method of claim 16, wherein the two layer film is a compressive stress nitride film.

23. The method of claim 1, wherein the first gas mixture further comprises a nitrogen source or an oxygen source.

24. The method of claim 1, wherein the initiation layer further comprises nitrogen or oxygen.

* * * * *

UNITED STATES PATENT AND TRADEMARK OFFICE
CERTIFICATE OF CORRECTION

PATENT NO. : 7,790,635 B2
APPLICATION NO. : 11/610991
DATED : September 7, 2010
INVENTOR(S) : Balseanu et al.

It is certified that error appears in the above-identified patent and that said Letters Patent is hereby corrected as shown below:

In the Detailed Description:

Column 3, Line 18, please delete "suicide" and insert -- silicide -- therefor;

Column 4, Line 37, please delete "hexamethyidisilazane" and insert -- hexamethyldisilazane -- therefor;

In the Claims:

Column 9, Claim 16, Line 22, delete "turninq" and insert -- turning -- therefor.

Signed and Sealed this

Twenty-first Day of December, 2010

David J. Kappos
*Director of the United States Patent and Trademark Office*